United States Patent
Hendricks

(10) Patent No.: US 10,694,153 B2
(45) Date of Patent: Jun. 23, 2020

(54) IMAGER WITH WIRE HARNESS CONNECTING FEATURES

(71) Applicant: Gentex Corporation, Zeeland, MI (US)

(72) Inventor: Michael G. Hendricks, Wyoming, MI (US)

(73) Assignee: GENTEX CORPORATION, Zeeland, MI (US)

( * ) Notice: Subject to any disclaimer, the term of this patent is extended or adjusted under 35 U.S.C. 154(b) by 28 days.

(21) Appl. No.: 15/712,608

(22) Filed: Sep. 22, 2017

(65) Prior Publication Data

US 2018/0091779 A1 Mar. 29, 2018

Related U.S. Application Data

(60) Provisional application No. 62/398,883, filed on Sep. 23, 2016.

(51) Int. Cl.
| | |
|---|---|
| H04N 5/225 | (2006.01) |
| H04N 7/18 | (2006.01) |
| G02B 7/02 | (2006.01) |
| B60R 16/02 | (2006.01) |
| G02B 13/00 | (2006.01) |
| H04N 5/217 | (2011.01) |
| H05K 1/14 | (2006.01) |
| H05K 1/18 | (2006.01) |
| G02B 27/01 | (2006.01) |

(52) U.S. Cl.
CPC ......... *H04N 7/183* (2013.01); *B60R 16/0207* (2013.01); *G02B 7/022* (2013.01); *G02B 7/023* (2013.01); *G02B 13/0015* (2013.01); *H04N 5/217* (2013.01); *H04N 5/2251* (2013.01); *H05K 1/14* (2013.01); *H05K 1/189* (2013.01); *G02B 2027/0138* (2013.01); *H05K 2201/10121* (2013.01)

(58) Field of Classification Search
CPC .................. H04N 5/225–2254; H04N 5/2257
USPC ................................................ 348/373–375
See application file for complete search history.

(56) References Cited

U.S. PATENT DOCUMENTS

| | | |
|---|---|---|
| 3,659,307 A | 5/1972 | Vitou |
| 4,410,563 A | 10/1983 | Richter et al. |
| 4,699,478 A | 10/1987 | Tsui et al. |
| 4,736,218 A | 4/1988 | Kutman |
| 5,068,770 A | 11/1991 | Baziuk |
| 5,121,200 A | 6/1992 | Choi |
| 5,315,333 A | 5/1994 | Nash |
| 5,418,567 A | 5/1995 | Boers et al. |
| 5,761,556 A | 6/1998 | Ichino |

(Continued)

FOREIGN PATENT DOCUMENTS

| | | | |
|---|---|---|---|
| EP | 1529688 B1 | 2/2007 | |
| JP | 2007022364 A | * 2/2007 | ............... B60R 1/00 |

(Continued)

*Primary Examiner* — Anthony J Daniels
(74) *Attorney, Agent, or Firm* — Price Heneveld LLP; Bradley D. Johnson

(57) ABSTRACT

An imager having a lens defining a viewing angle. A lens holder is operably coupled with the lens. A printed circuit board includes a flex connector. The flex connector is operably coupled with a wire harness that extends in a direction orthogonal to the viewing angle. A housing includes a cover and a base. An electromagnetic interference shield is disposed on a rear surface of the base.

16 Claims, 7 Drawing Sheets

(56) References Cited

U.S. PATENT DOCUMENTS

| | | | |
|---|---|---|---|
| 6,138,319 A | 10/2000 | Benoit | |
| 6,607,606 B2 | 8/2003 | Bronson | |
| 6,619,806 B2 | 9/2003 | Akami et al. | |
| 6,731,867 B1 | 5/2004 | Sherwin | |
| 6,911,997 B1 | 6/2005 | Okamoto et al. | |
| 7,104,657 B2 | 9/2006 | Sherwin | |
| 7,355,629 B2 | 4/2008 | Lang et al. | |
| 7,387,454 B2 | 6/2008 | Kikuchi et al. | |
| 7,579,939 B2 | 8/2009 | Schofield et al. | |
| 7,630,624 B2 | 12/2009 | Chang | |
| 7,813,639 B2 | 10/2010 | Yoneji | |
| 7,883,064 B2 | 2/2011 | Luft et al. | |
| 7,891,886 B2 | 2/2011 | Schuetz | |
| 7,965,336 B2 | 6/2011 | Bingle et al. | |
| 8,031,224 B2 | 10/2011 | Linsenmaier et al. | |
| 8,077,406 B2 | 12/2011 | Hachitani et al. | |
| 8,118,501 B2 | 2/2012 | Buschmann | |
| 9,366,833 B2* | 6/2016 | Ogura | G02B 6/4249 |
| 9,992,392 B2* | 6/2018 | Byrne | B60R 1/00 |
| 2005/0275738 A1 | 12/2005 | Arai | |
| 2006/0171704 A1 | 8/2006 | Bingle et al. | |
| 2006/0256459 A1 | 11/2006 | Izabel et al. | |
| 2007/0132610 A1 | 6/2007 | Guernalec et al. | |
| 2007/0223899 A1 | 9/2007 | Snow | |
| 2011/0033663 A1 | 2/2011 | Svec et al. | |
| 2011/0037863 A1 | 2/2011 | Mihota et al. | |
| 2011/0141281 A1 | 6/2011 | Barefoot et al. | |
| 2011/0199485 A1* | 8/2011 | Nakamura | G02B 13/001 348/148 |
| 2011/0249120 A1* | 10/2011 | Bingle | B60R 11/04 348/148 |
| 2012/0071028 A1* | 3/2012 | Lai | H01R 13/6596 439/607.19 |
| 2013/0222596 A1* | 8/2013 | Han | G03B 17/08 348/148 |
| 2014/0253731 A1 | 9/2014 | Suman et al. | |
| 2015/0029337 A1* | 1/2015 | Uchiyama | H04N 5/2252 348/148 |
| 2015/0222795 A1* | 8/2015 | Sauer | H04N 5/2257 348/148 |
| 2015/0281527 A1* | 10/2015 | Mano | G03B 17/08 348/374 |
| 2015/0327377 A1 | 11/2015 | Mano et al. | |
| 2015/0340816 A1* | 11/2015 | Abe | H01R 13/6582 439/607.34 |
| 2015/0365569 A1* | 12/2015 | Mai | H04N 5/2252 348/373 |
| 2016/0062110 A1 | 3/2016 | Kashima et al. | |
| 2016/0191863 A1 | 6/2016 | Minikey, Jr. et al. | |
| 2018/0143395 A1* | 5/2018 | Takahashi | H04N 5/2254 |
| 2018/0255213 A1* | 9/2018 | Ahn | B60R 1/00 |
| 2019/0121050 A1* | 4/2019 | Park | B29C 65/48 |
| 2019/0132954 A1* | 5/2019 | Kim | G02B 7/02 |

FOREIGN PATENT DOCUMENTS

| | | | | |
|---|---|---|---|---|
| JP | 2015210292 A | | 11/2015 | |
| JP | 2018045792 A | * | 3/2018 | H01R 13/648 |

* cited by examiner

IMAGER WITH WIRE HARNESS CONNECTING FEATURES

CROSS-REFERENCE TO RELATED APPLICATION

This application claims priority to and the benefit under 35 U.S.C. § 119(e) of U.S. Provisional Patent Application No. 62/398,883, filed on Sep. 23, 2016, entitled "CAMERA WITH BOTTOM EXIT CONNECTOR OR BOTTOM EXIT WIRE HARNESS," the disclosure of which is hereby incorporated herein by reference in its entirety.

FIELD OF THE DISCLOSURE

The present disclosure generally relates to an imager, and more particularly to an imager with wire harness connecting features.

SUMMARY OF THE DISCLOSURE

According to one aspect of the present disclosure, an imager having a lens defining a viewing angle. A lens holder is operably coupled with the lens. A printed circuit board includes an imager board and a connector board coupled by a flex laminate. The flex laminate is operably coupled with a wire harness that extends in a direction generally orthogonal to the viewing angle. A housing includes a cover and a base. The cover and the base interface along a plane intersecting a line perpendicular with the lens and a line defined by the longitudinal extent of the wire harness. An electromagnetic interference shield is disposed on a rear surface of the base.

According to another aspect of the present disclosure, an imager includes a lens defining a viewing angle. A lens holder is operably coupled with the lens. A printed circuit board includes an imager board that is fastened to the lens holder and a connector board that is unfastened within the lens holder. A flex connector is operably coupled with a wire harness that extends in a direction generally orthogonal to a principal axis of the viewing angle of the lens. A housing includes a rear opening. A wire harness cover is operably coupled with the rear opening and directs the wire harness in a direction generally orthogonal to the viewing angle.

According to yet another aspect of the present disclosure, an imager includes a lens defining a viewing angle. A lens holder is operably coupled with the lens. A housing includes a bottom aperture and a rear cover. A printed circuit board includes a fixed imager board and a connector board. A flex connector operably couples the imager board with the connector board. The connector board is in detachable engagement with a wire harness that extends through the bottom aperture.

These and other features, advantages, and objects of the present disclosure will be further understood and appreciated by those skilled in the art by reference to the following specification, claims, and appended drawings.

DETAILED DESCRIPTION

Figure 1:
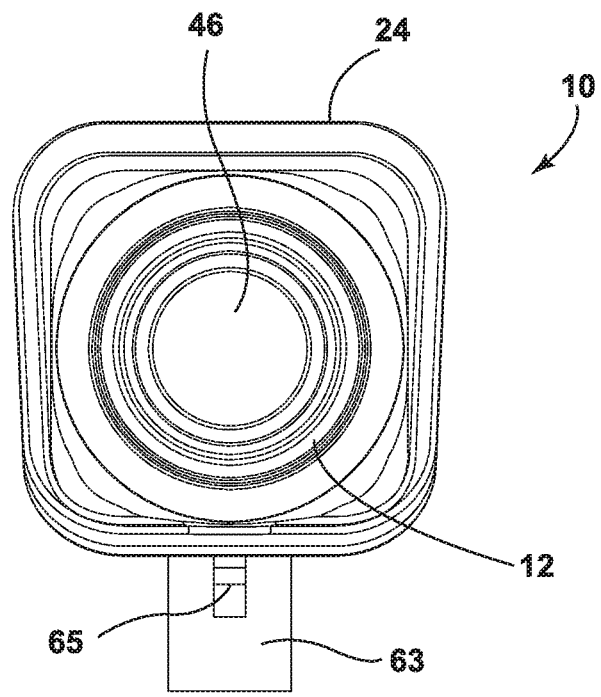
FIG. 1 is a front elevational view of an imager of the present disclosure.
Figure 2:
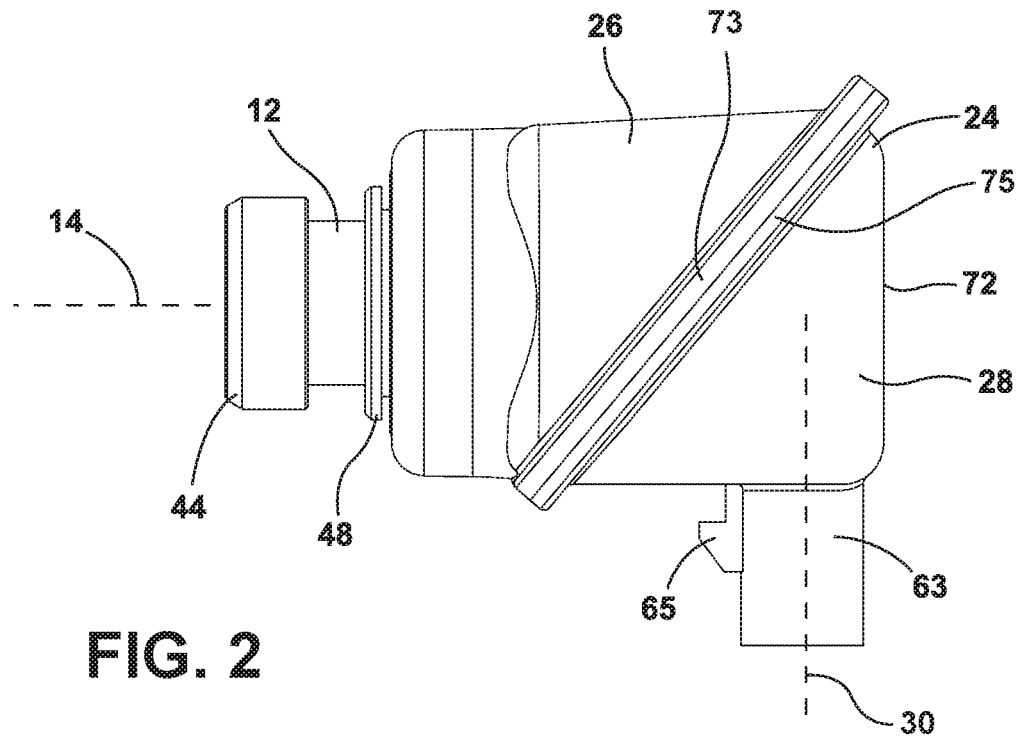
FIG. 2 is a side elevational view of the imager of FIG. 1.
Figure 3:
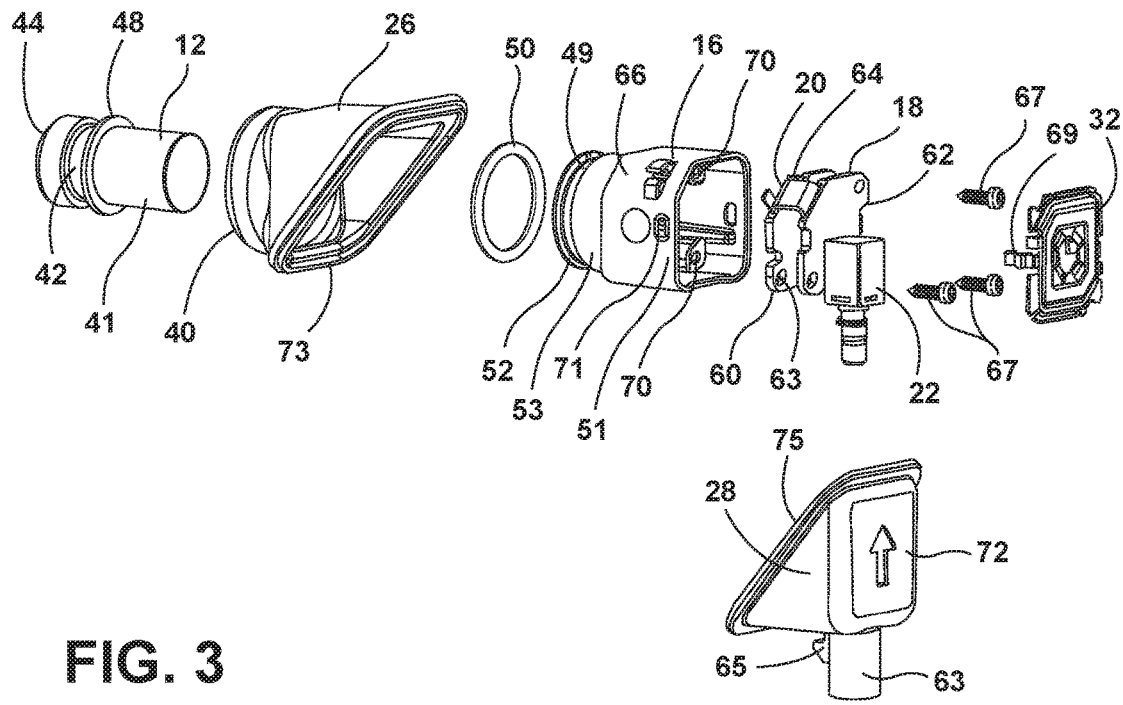
FIG. 3 is a rear perspective exploded view of the imager of FIG. 1.
Figure 4:
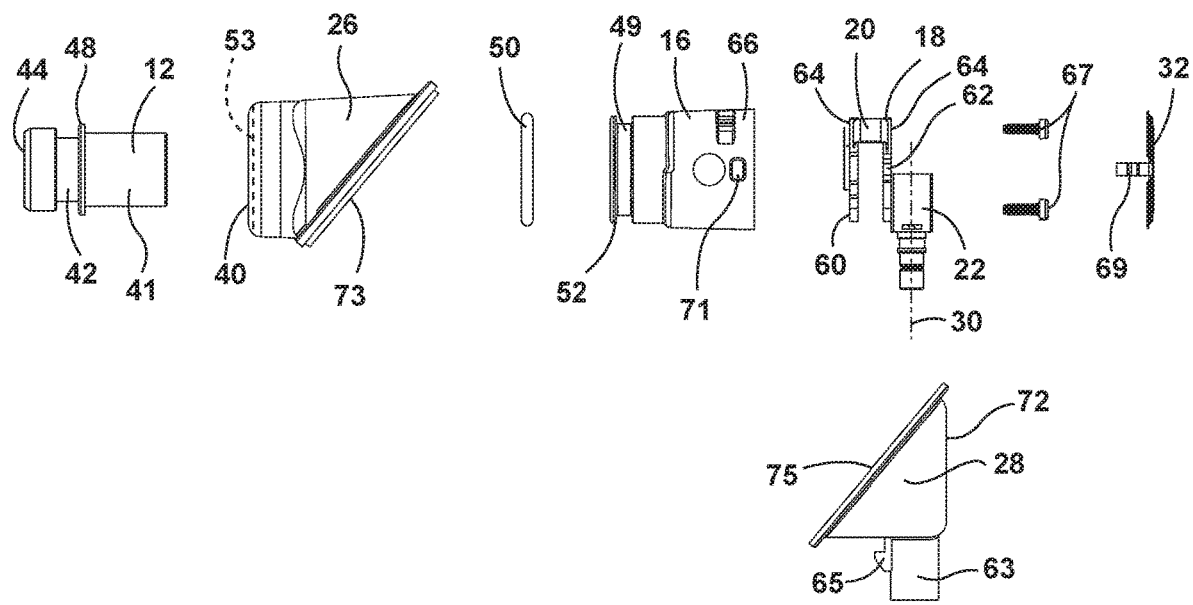
FIG. 4 is a side exploded elevational view of the imager of FIG. 1.
Figure 5:
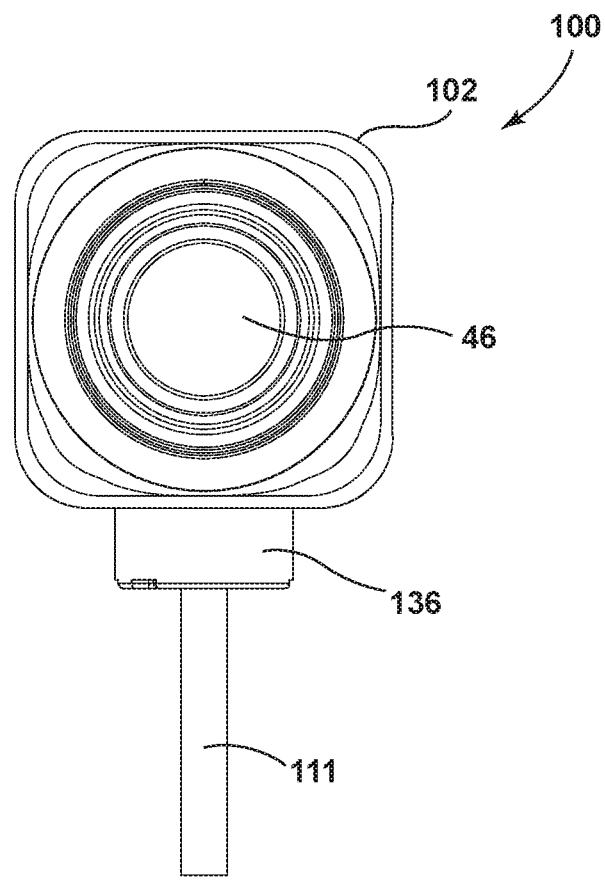
FIG. 5 is a front elevational view of an imager of the present disclosure.
Figure 6:
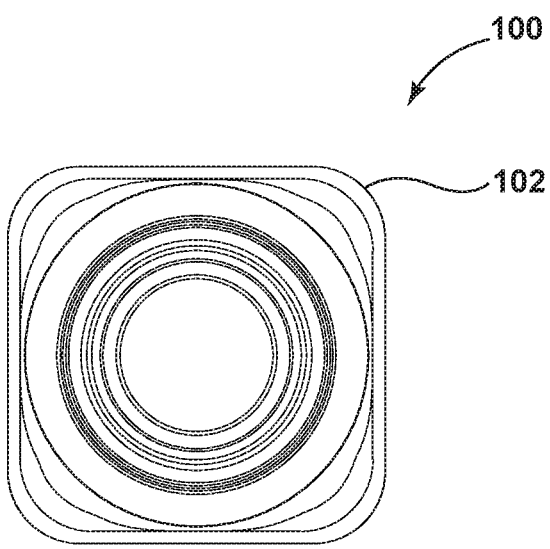
FIG. 6 is a front elevational view of the imager of FIG. 5 with the wire harness removed.
Figure 7:
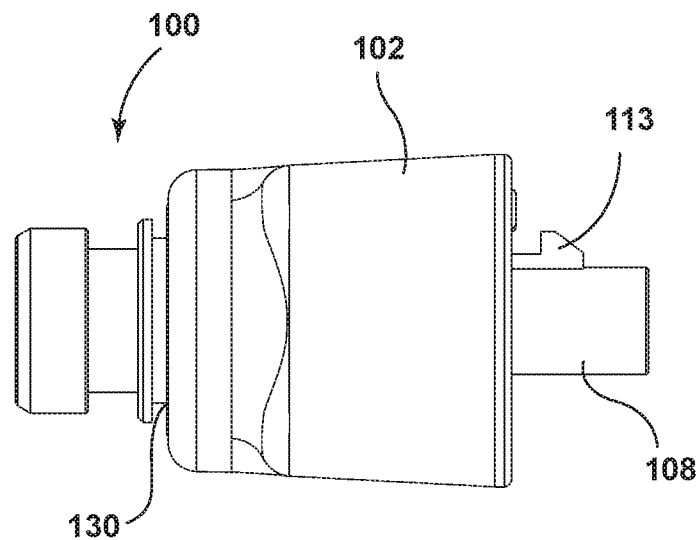
FIG. 7 is a side elevational view of the imager of FIG. 5 with the elbow connector removed.

The present illustrated embodiments reside primarily in combinations of method steps and apparatus components related to an imager. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

For purposes of description herein, the terms "upper," "lower," "right," "left," "rear," "front," "vertical," "horizontal," and derivatives thereof, shall relate to the disclosure as oriented in FIG. 1. Unless stated otherwise, the term "front" shall refer to the surface of the device closer to an intended viewer of the device, and the term "rear" shall refer to the surface of the device further from the intended viewer of the device. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises a . . . " does not, without more constraints, preclude the existence of additional identical elements in the process, method, article, or apparatus that comprises the element.

Referring to FIGS. 1-4, reference numeral 10 generally designates an imager having a lens assembly 12 defining a line of sight 14. A lens holder 16 is operably coupled with the lens assembly 12. A printed circuit board (PCB) 18 includes a flex laminate 20. The PCB 18 is operably coupled with a wire harness plug 22 that extends downwardly in a direction normal to the line of sight 14. A housing 24 includes a cover 26 and a base 28. The cover 26 and the base 28 interface along a plane intersecting a generally vertical line 30 (FIG. 4) defined by the longitudinal extent of the wire harness plug 22. An electromagnetic interference (EMI) shield 32 is disposed on a rear surface of the base 28.

With reference again to FIGS. 1-4, the illustrated imager 10 is generally configured to collect image data from an exterior of a vehicle. It will be understood that the imager 10 may also collect data from inside the vehicle. The lens assembly 12 of the imager 10 projects from a forward aperture 40 of the housing 24. The lens assembly 12 includes a body 41 that is generally disposed within the housing 24 after assembly. The lens assembly 12 also includes a barrel 42 with an end cap 44 disposed on a distal end of the barrel 42. The barrel 42 also includes an annular ring 48 that extends about the barrel 42. The end cap 44 includes a protective lens cover 46 that protects an internal optic lens from moisture, dirt, debris, etc. The barrel 42 of the lens assembly 12 extends into the cover 26 of the housing 24. An O-ring 50 is disposed inside the housing 24. The O-ring 50 interface is between the lens holder 16 and the cover 26. The O-ring 50 is configured to engage an annular groove 49 behind an annular flange 52. The annular groove 49 and the annular flange 52 are located at a forward portion of the lens holder 16 and provide a sealed engagement proximate an inner wall 53 of the housing 24. The lens assembly 12 is adhered to the lens holder 16. The lens holder 16 may include a generally square or rectangular body defined by walls 51. A forward cylindrical portion 53 extends forward from the body. The lens holder 16 is configured to secure the lens assembly 12 within the cover 26, and at the same time provide secure engagement of the PCB 18 within the housing 24. The lens holder 16 also provides EMI protection due to its metallic properties.

With reference again to FIGS. 1-4, the PCB 18 includes an imager board 60 and a connector board 62, which are coupled by a flex connector in the form of the flex laminate 20. It will be understood that for each of the imagers discussed herein, the imager board 60 and the connector board 62, could also be attached with a board-to-board connector or a short harness. The imager board 60 interfaces with the lens assembly 12, while the connector board 62 interfaces with a power and/or data plug that relays and receives data and/or power while operably coupled to a vehicle. The imager board 60 is disposed forward of the connector board 62, closer to the lens assembly 12. In the illustrated embodiment, the imager board 60 is spaced a predetermined distance from the connector board 62. In addition, a planar extent of the imager board 60 and a planar extent of the connector board 62 are generally parallel. However, the imager board 60 and the connector board 62 could also be arranged orthogonally, diagonally, etc. This construction provides for a smaller, tighter imager package. Both the imager board 60 and the connector board 62 may include a multitude of software and hardware features providing functionality to the imager 10. The connector board 62 is also coupled with the wire harness plug 22 that extends in a direction normal to line of sight, and which may be a permanent or detachable coupling. The wire harness plug 22 may provide a power and/or data connection to the PCB 18. The wire harness plug 22 is configured to extend into a hollow connecting feature 63 in the form of a cylindrical plug that projects downwardly from the base 28 of the housing 24. The connecting feature 63 includes a hooked engagement member 65 configured to secure the wire harness plug 22 with a complementary connector of the vehicle. The wire harness plug 22 provides connectability for both data and power, which are routed through the hollow connecting feature 63 and connected with the wire harness plug 22. The wire harness plug 22 then provides data and/or power to the connector board 62 and the imager board 60. The flex laminate 20 connects at a chamfered corner 64 of the imager board 60 and the connector board 62. However, it will be understood that the flex laminate 20 could connect at another edge or edges of the imager board 60 and the connector board 62. The chamfered corner 64 is also aligned with a chamfered corner 66 of the lens holder 16. The chamfered corner 64 is free of mechanical fasteners. However, each of the remaining corners of the imager board 60 and the connector board 62 may be secured via mechanical fasteners within the lens holder 16.

Referring once again to FIGS. 1-4, a plurality of mechanical fasteners 67 are disposed behind the connector board 62, which are received into the connecting apertures 63 that extend through the imager board 60, the connector board 62, or both the imager board 60 and the connector board 62. The mechanical fasteners 67 secure the imager board 60 with fastener receivers 70 inside the lens holder 16. As illustrated, the connector board 62 is free floating, thereby allowing for some small movement during construction, which minimizes stresses that might otherwise be placed on the connector board 62 during manufacturing. The EMI shield 32 is disposed behind the PCB 18. Spring arms 69 of the EMI shield 32 snap into retention features 71 defined in the walls 51 of the lens holder 16. The EMI shield 32 is configured to abut a rear wall 72 of the base 28. Notably, the base 28 and the cover 26 interface along a plane that intersects the line 30 that extends vertically along the longitudinal axis of the wire harness plug 22. The interface of the base 28 and the cover 26 extends from a forward bottom edge of the housing 24 to a rearward top edge of the housing 24. The plane also intersects a line defined by the line of sight 14, but extending rearwardly, that projects forward of the lens assembly 12. Stated differently, if the line of sight 14 was projected rearwardly through the imager 10, the interface plane of the base 28 and the cover 26 would intersect that line. A rim 73 of the cover 26 interfaces with a rim 75 of the base 28 at the interface plane. A gasket may be disposed between the cover 26 and the base 28 at the interface plane. The angle between the cover 26 and the base 28 provides clearance during assembly. It should be noted that the angle of the interface plane may vary. The purpose of the angled interface is to make room for the molded connector in the base 28, and to allow for clearance that may be desirable during the assembly of the base 28 to the cover 26.

With reference now to FIGS. 5-10, an imager 100 is illustrated that includes a housing 102 that protects the inner components of the imager 100. Notably, the inner components of the imager 100, including the lens assembly 12, the O-ring 50, the lens holder 16, the PCB 18, and the EMI shield 32, are the same or similar to the components referenced in FIGS. 1-4. Accordingly, to minimize redundancy, these components will not be further detailed. It will be understood that the features of the inner components, as outlined above, also apply to this construction, where appropriate, and may include like reference numerals. The housing 102 protects the inner components from dirt, debris, moisture, etc. The barrel 42 of the lens assembly 12 projects into a forward aperture 104 of the housing 102. The housing 102 includes a rearward aperture configured to receive the O-ring 50, the lens holder 16, the PCB 18, and the rear EMI shield 32.

With reference again to FIGS. 9 and 10, a rear wall 106 of the housing 102 includes a hollow connecting feature 108 that is configured to protect a wire harness plug 112 that extends rearwardly from the connector board 62 of the PCB 18 and engages a wire harness 111. The wire harness plug 112 may extend rearwardly from the connector board 62 in axial alignment with the barrel 42 of the lens assembly 12. Alternatively, the wire harness plug 112 may be offset relative to the barrel 42. A locating feature 109 may be disposed on the rear wall 106 and configured to help align the rear wall 106 with the housing 102 during assembly. The locating feature 109 is configured to engage a complementary locating feature 110 within the housing 102. The wire harness plug 112 includes a hooked engagement member 113 that engages one of a straight connector or an elbow connector 114. The engagement may be a snap-fit connection. The rear EMI shield 32 is disposed within the housing 102 and abuts against the rear wall 106 of the housing 102. The rear EMI shield 32 extends behind the connector board 62 and includes an aperture 116 through which the wire harness plug 112 extends into the wire harness 111 of the rear wall 106 of the housing 102. The rear EMI shield 32 includes the opposing spring arms 69 configured to engage the retention features 71 of the lens holder 16. In this construction, the lens holder 16 also includes forward and rearward annular flanges 120, 122 that form a groove 121 for receiving the O-ring 50. The forward annular flange 120 abuts against either the barrel 42 of the lens assembly 12 or an inner wall 126 of the housing 102 that defines the forward aperture 104. Thus, the O-ring 50 rests between the forward annular flange 120 and the rearward annular flange 122 to create a generally sealed environment to protect the internal components within the housing 102. The O-ring 50 also extends around the body 41 of the lens assembly 12.

Figure 8:
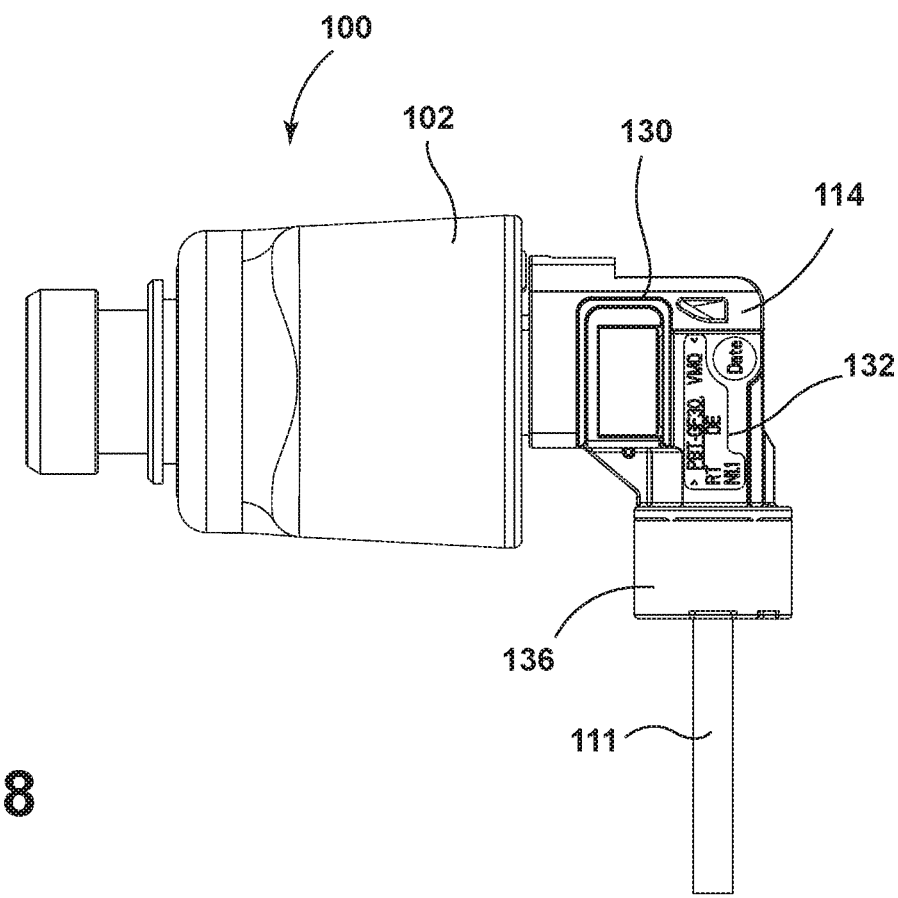
FIG. 8 is a side elevational view of the imager of FIG. 5.
Figure 9:
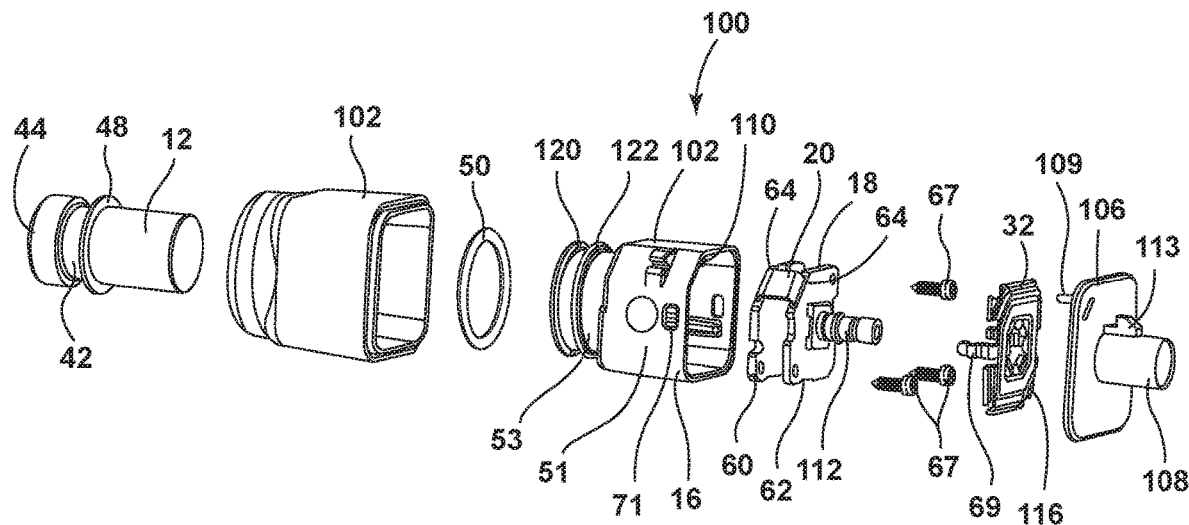
FIG. 9 is a rear perspective exploded view of the imager of FIG. 5 with the elbow connector removed.
Figure 10:
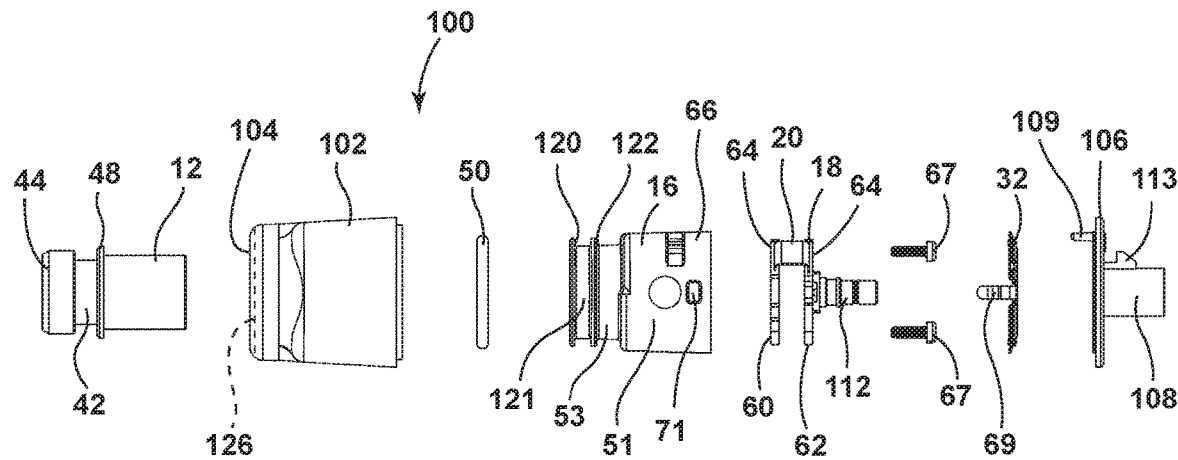
FIG. 10 is a side elevational exploded view of the imager of FIG. 5 with the elbow connector removed.
Figure 11:
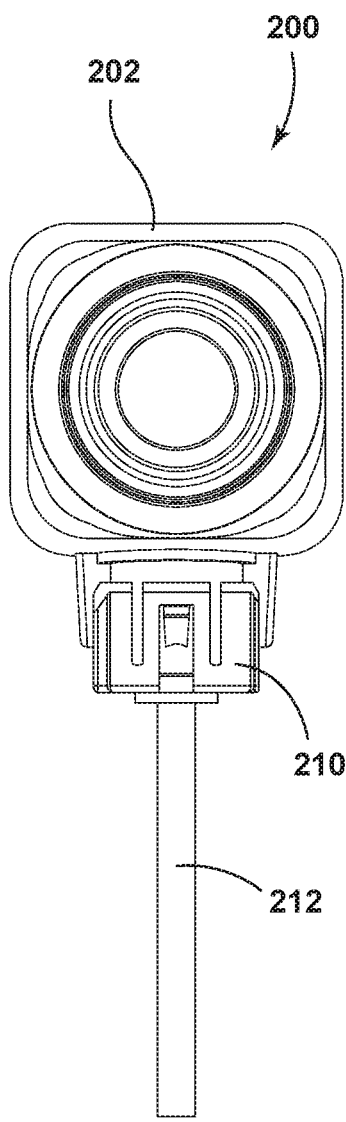
FIG. 11 is a front elevational view of an imager of the present disclosure.
Figure 12:
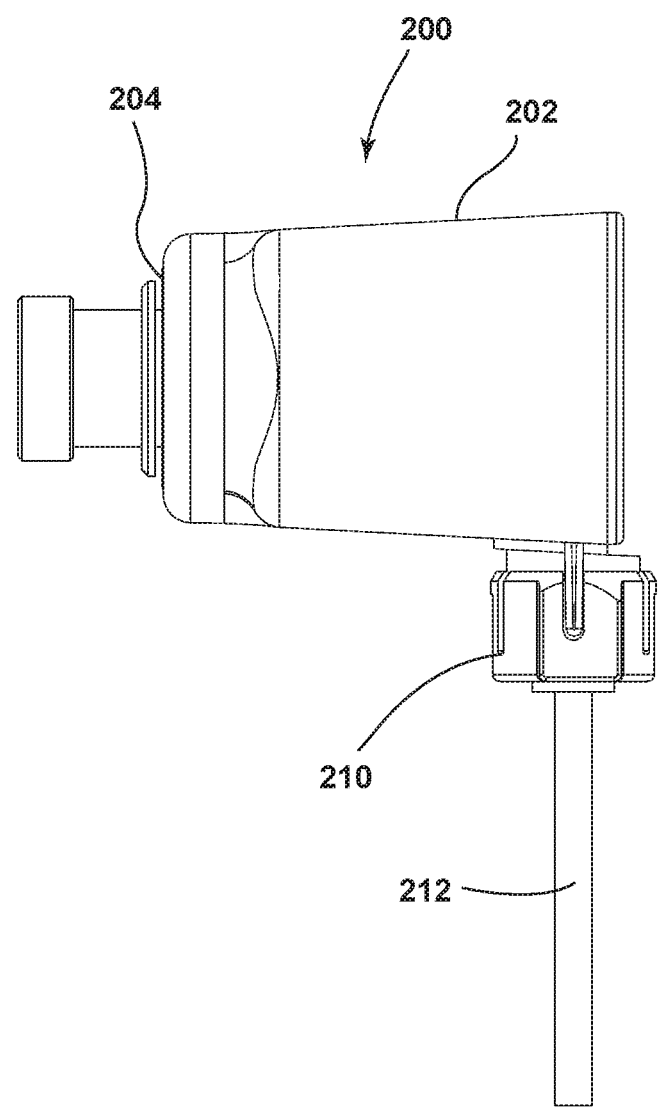
FIG. 12 is a side elevational view of the imager of FIG. 11.
Figure 13:
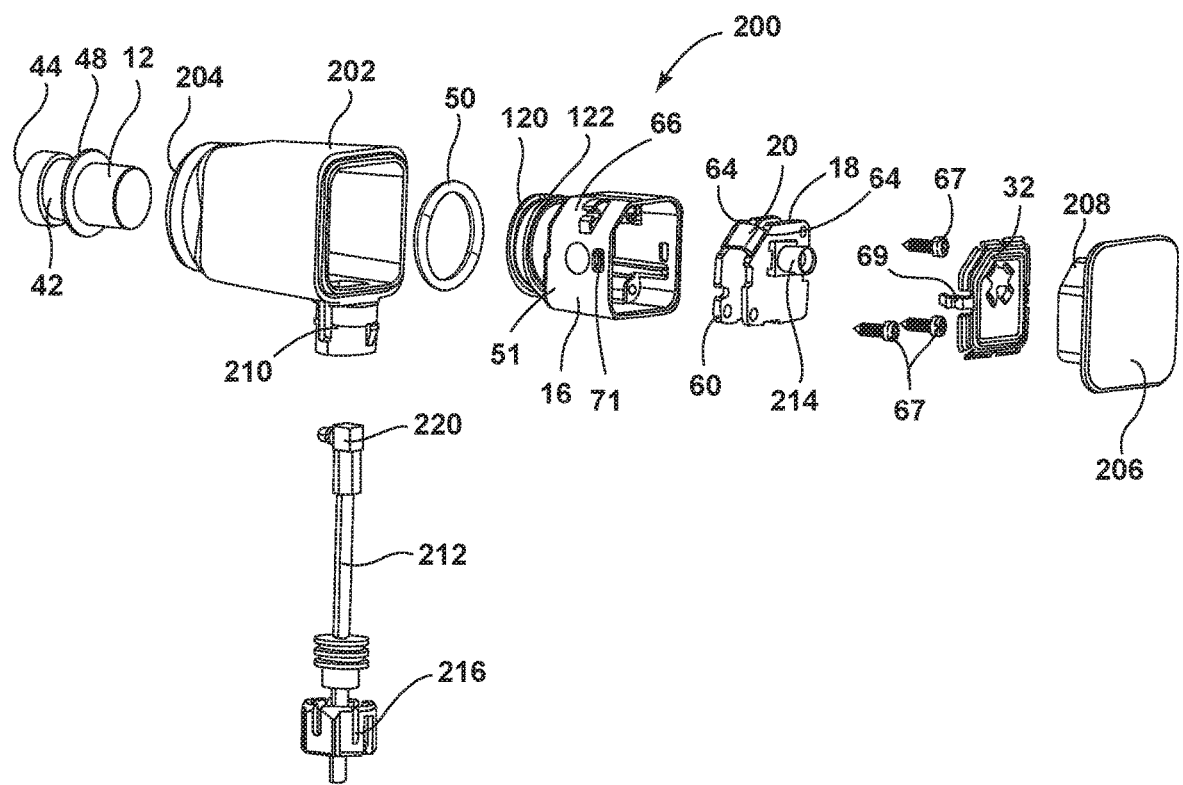
FIG. 13 is a rear perspective exploded view of the imager of FIG. 11.
Figure 14:
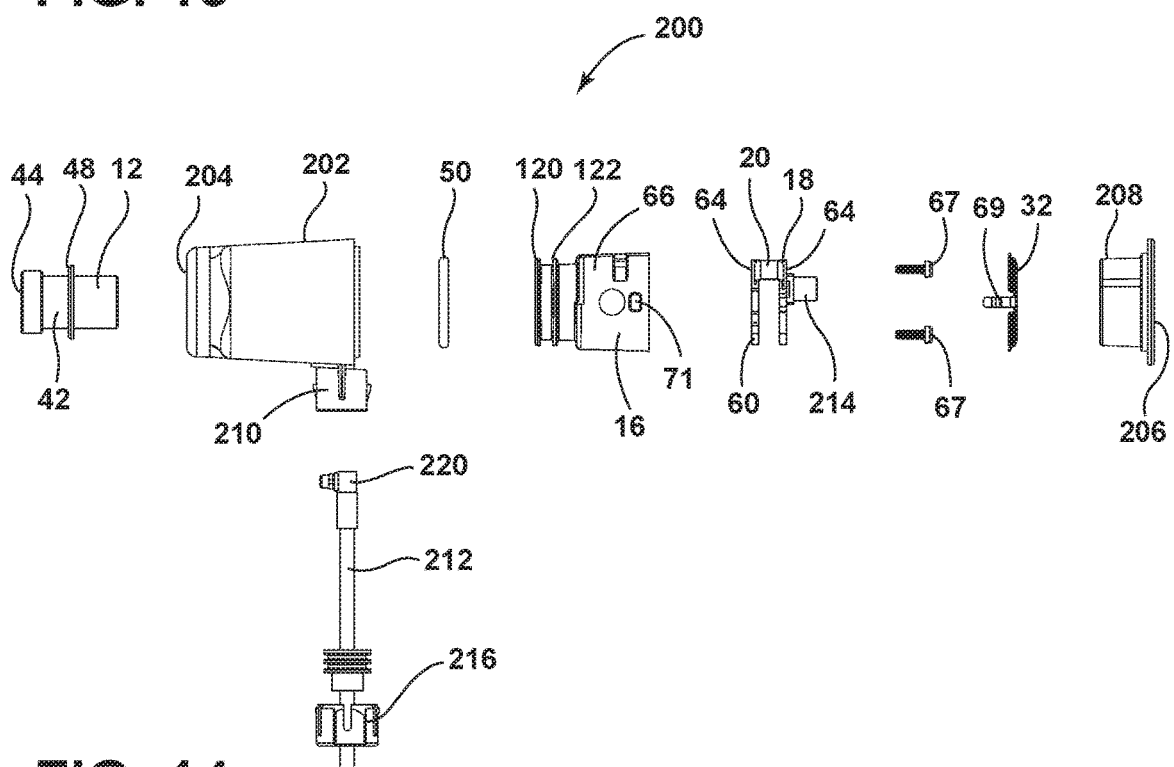
FIG. 14 is a side elevational exploded view of the imager of FIG. 11.

As shown in FIG. 8, the rear wall 106, and specifically the hollow connecting feature 108, is configured to engage the elbow connector 114, which includes a lateral portion 130 and a vertical portion 132. A securing collar 136 is disposed below the vertical portion 132 and maintains the wire harness plug 112 in secure engagement with the housing 102 and the PCB 18. The securing collar 136 may be snap-fit or threaded and tightened against the vertical portion 132 to secure the wire harness 111 and seal the opening where the wire harness 111 enters the elbow connector 114.

With reference now to FIGS. 11-14, an imager 200 is illustrated that includes a housing 202 with a forward aperture 204 configured to receive the barrel 42 of the lens assembly 12. The barrel 42 projects from the housing 202 through the forward aperture 204. A rear wall 206 of the imager 200 may be removable and includes an abutment flange 208 that extends into the housing 202. A bottom portion of the housing 202 includes a connecting feature 210 in the form of a mechanical clip configured to receive a power and/or data wiring harness 212. The power and/or data wiring harness 212 is operably coupled with a plug 214 of the connector board 62 of the PCB 18. The connecting feature 210 of the housing 202 engages a coupler 216 on the power and/or data wiring harness 212 to secure the power and/or data wiring harness 212 such that the power and/or data wiring harness 212 does not come unplugged from the plug 214 of the PCB 18. The connecting feature 210 also holds a seal on the wire harness 212 to seal the housing 202 where the wire harness 212 enters the housing 202. As illustrated, the plug 214 receives a connector 220 of the wiring harness 212. It will be understood that many of the internal components of the imager 200 are similar to the components described above and are referenced with like reference numerals.

With reference to all of FIGS. 1-14, the lens holder 16 is generally performing a multitude of functions within the housing 24. Specifically, the lens holder 16 fixedly supports the imager board 60 and provides enough space for the connector board 62 to free float. This function is particularly useful when coupling the wire harness plug with the connector board 62 during assembly. By allowing the connector board 62 to free float, there are no undue stresses placed on the connector board 62. In addition, flexible room is provided within the lens holder 16 before attaching the EMI shield 32. However, it will be noted that in some applications, having a fixed connector board 62 and a fixed imager board 60 may prove useful during assembly.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:

1. An imager comprising:
a lens defining a viewing angle;
a lens holder operably coupled with the lens;
a printed circuit board including an imager board and a connector board coupled by a flex laminate, the printed circuit board being operably coupled with a wire harness that extends in a direction generally orthogonal to the viewing angle;
a housing including a cover and a base, wherein the cover and the base interface along a plane intersecting a line perpendicular with the lens and a line defined by the longitudinal extent of the wire harness;
an electromagnetic interference shield disposed on a rear surface of the base between the connector board and the base; and
a wire harness plug that extends between the connector board and the electromagnetic interference shield.

2. The imager of claim 1, wherein the electromagnetic interference shield includes a spring arm that engages a wall of the lens holder.

3. The imager of claim 1, wherein the flex laminate connects to a chamfered corner of the connector board and the imager board.

4. The imager of claim 1, wherein a forward annular flange of the lens holder is seated against an inner wall of the cover of the housing.

5. The imager of claim 1, wherein the interface of the base and the cover extends from a forward bottom edge of the housing to a rearward top edge of the housing.

6. An imager comprising:
a lens defining a viewing angle;
a lens holder operably coupled with the lens;
a printed circuit board including an imager board that is fastened directly to the lens holder and a connector board that is unfastened within the lens holder;
a flex connector operably coupled with a wire harness that extends in a direction generally orthogonal to a principal axis of the viewing angle of the lens, wherein the flex connector connects to a chamfered corner of the connector board and the imager board;
a housing including a rear opening; and
a wire harness cover operably coupled with the rear opening of the housing and directing the wire harness in a direction generally orthogonal to the viewing angle.

7. The imager of claim 6, further comprising:
a wire harness plug that extends between the connector board and an electromagnetic interference shield.

8. The imager of claim 7, wherein the electromagnetic interference shield includes a spring arm that engages a wall of the lens holder.

9. The imager of claim 6, wherein a forward annular flange of the lens holder is seated against an inner wall of the wire harness cover.

10. The imager of claim 6, wherein an interface of the wire harness cover and a base extends from a forward bottom edge of the housing to a rearward top edge of the housing.

11. The imager of claim 7, wherein the wire harness plug extends through the electromagnetic interference shield.

12. An imager comprising:
a lens defining a viewing angle;
a lens holder operably coupled with the lens;
a housing including a bottom aperture and a rear cover;
a printed circuit board including a fixed imager board and a floating connector board;
a flex connector operably coupling the imager board with the connector board, the connector board being in detachable engagement with a wire harness that extends through the bottom aperture; and
a wire harness plug that extends between the connector board and an electromagnetic interference shield.

13. The imager of claim 12, wherein the electromagnetic interference shield includes a spring arm that engages a wall of the lens holder.

14. The imager of claim 12, wherein the flex connector connects to a chamfered corner of the connector board and the fixed imager board.

15. The imager of claim 12, wherein a forward annular flange of the lens holder is seated against an inner wall of the housing.

16. The imager of claim 12, wherein an interface of the rear cover and a base extends from a forward bottom edge of the housing to a rearward top edge of the housing.

* * * * *